(12) United States Patent
Bolken

(10) Patent No.: US 6,664,139 B2
(45) Date of Patent: Dec. 16, 2003

(54) METHOD AND APPARATUS FOR PACKAGING A MICROELECTRONIC DIE

(75) Inventor: Todd O. Bolken, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/955,613

(22) Filed: Sep. 19, 2001

(65) Prior Publication Data

US 2002/0048843 A1 Apr. 25, 2002

Related U.S. Application Data

(62) Division of application No. 09/595,623, filed on Jun. 16, 2000.

(51) Int. Cl.[7] ............................................... H01L 21/44
(52) U.S. Cl. ....................................... 438/127; 438/124
(58) Field of Search ................................ 438/127, 106, 438/124, 125, 126, 118, 116, FOR 372, FOR 374, FOR 384, 109, 110; 425/116, 117

(56) References Cited

U.S. PATENT DOCUMENTS

| | | |
|---|---|---|
| 3,672,046 A | 6/1972 | Storey, II et al. |
| 4,285,780 A | 8/1981 | Schachter |
| 4,769,344 A | 9/1988 | Sakai et al. |
| 4,777,520 A | 10/1988 | Nambu et al. |
| 4,855,807 A | 8/1989 | Yamaji et al. |

(List continued on next page.)

FOREIGN PATENT DOCUMENTS

| | | | |
|---|---|---|---|
| JP | 60208847 A | * | 10/1985 |
| JP | 62032622 A | * | 2/1987 |
| JP | 62229949 A | * | 10/1987 |
| JP | 01244629 A | * | 9/1989 |
| JP | 05299536 A | * | 11/1993 |

(List continued on next page.)

OTHER PUBLICATIONS

U.S. patent application Ser. No. 09/645,640, James et al., filed Aug. 24, 2000.
U.S. patent application Ser. No. 09/649,428, Cobbley, filed Aug. 28, 2000.

(List continued on next page.)

Primary Examiner—Olik Chaudhuri
Assistant Examiner—Brook Kebede
(74) Attorney, Agent, or Firm—Perkins Coie LLP

(57) ABSTRACT

The present invention is directed toward methods and apparatuses for encapsulating a microelectronic die or another type of microelectronic device. One aspect of the present invention is directed toward packaging a microelectronic die that is attached to either a first surface or a second surface of a substrate. The die can be encapsulated by positioning the die in a cavity of a substrate and sealing the substrate to the substrate. The method can further include injecting an encapsulation compound into the cavity at a first end of the substrate to move along the first surface of the substrate. This portion of the compound defines a first flow of compound along the first surface that moves in a first direction from a first end of the substrate toward a second end of the substrate. Several embodiments of the method also include driving a portion of the compound through the substrate at a pass-through location or a secondary gate that is spaced apart from the first end of the substrate to generate a second flow of compound along the second surface of the substrate. The second flow of compound moves in a second direction toward the first end of the substrate. As the first and second flows of compound move through the mold, the method includes inhibiting a third flow of compound from moving in the first direction along the second surface of the substrate between the first end of the substrate and the pass-through location.

7 Claims, 5 Drawing Sheets

U.S. PATENT DOCUMENTS

| | | | |
|---|---|---|---|
| 4,866,506 A | 9/1989 | Nambu et al. | |
| 4,882,212 A | 11/1989 | SinghDeo et al. | |
| 4,887,149 A | 12/1989 | Ramano | |
| 5,107,328 A | 4/1992 | Kinsman | |
| 5,128,831 A | 7/1992 | Fox, III et al. | |
| 5,138,434 A | 8/1992 | Wood et al. | |
| 5,147,821 A | 9/1992 | McShane et al. | |
| 5,191,174 A | 3/1993 | Chang et al. | |
| 5,195,023 A | 3/1993 | Manzione et al. | |
| 5,197,183 A | 3/1993 | Chia et al. | |
| 5,208,467 A | 5/1993 | Yamazaki | |
| 5,296,738 A | 3/1994 | Freyman et al. | |
| 5,309,026 A | 5/1994 | Matsumoto | |
| 5,314,842 A | 5/1994 | Sawaya et al. | |
| 5,363,280 A | 11/1994 | Chobot et al. | |
| 5,365,655 A | 11/1994 | Rose | |
| 5,474,958 A * | 12/1995 | Djennas et al. | 29/827 |
| 5,527,743 A * | 6/1996 | Variot | 29/827 |
| 5,578,261 A | 11/1996 | Manzione et al. | |
| 5,593,927 A | 1/1997 | Farnworth et al. | |
| 5,596,231 A | 1/1997 | Combs | |
| 5,606,204 A | 2/1997 | Tsuji | |
| 5,609,889 A | 3/1997 | Weber | |
| 5,612,576 A | 3/1997 | Wilson et al. | |
| 5,635,220 A | 6/1997 | Izumi et al. | |
| 5,665,281 A * | 9/1997 | Drummond | 264/39 |
| 5,665,296 A | 9/1997 | Jain et al. | |
| 5,677,566 A | 10/1997 | King et al. | |
| 5,696,033 A | 12/1997 | Kinsman | |
| 5,710,071 A | 1/1998 | Beddingfield et al. | |
| 5,721,450 A | 2/1998 | Miles | |
| 5,728,600 A | 3/1998 | Saxelby, Jr. et al. | |
| 5,739,585 A | 4/1998 | Akram et al. | |
| 5,750,423 A | 5/1998 | Ishii | |
| D394,844 S | 6/1998 | Farnworth et al. | |
| 5,766,649 A * | 6/1998 | Azuma | 425/116 |
| 5,767,446 A | 6/1998 | Ha et al. | |
| 5,773,322 A | 6/1998 | Weld | |
| 5,793,613 A | 8/1998 | Pionelli et al. | |
| 5,796,159 A | 8/1998 | Kierse | |
| 5,815,000 A | 9/1998 | Farnworth et al. | |
| D402,638 S | 12/1998 | Farnworth et al. | |
| 5,842,275 A | 12/1998 | McMillan, II et al. | |
| 5,851,845 A | 12/1998 | Wood et al. | |
| 5,866,953 A | 2/1999 | Akram et al. | |
| 5,891,753 A | 4/1999 | Akram | |
| 5,893,726 A | 4/1999 | Farnworth et al. | |
| 5,898,224 A | 4/1999 | Akram | |
| 5,917,234 A | 6/1999 | Tsuruzono | |
| 5,920,768 A | 7/1999 | Shintai | |
| 5,928,595 A * | 7/1999 | Knapp et al. | 264/272.17 |
| 5,933,713 A | 8/1999 | Farnworth | |
| 5,938,956 A | 8/1999 | Hembree et al. | |
| 5,945,130 A | 8/1999 | Saxelby, Jr. et al. | |
| 5,946,553 A | 8/1999 | Wood et al. | |
| 5,958,100 A | 9/1999 | Farnworth et al. | |
| 5,964,030 A | 10/1999 | Lee et al. | |
| 5,986,209 A | 11/1999 | Tandy | |
| 5,989,941 A | 11/1999 | Wensel | |
| 5,990,566 A | 11/1999 | Farnworth et al. | |
| 5,994,784 A | 11/1999 | Ahmad | |
| RE36,469 E | 12/1999 | Wood et al. | |
| 5,998,243 A * | 12/1999 | Odashima et al. | 438/127 |
| 6,000,924 A | 12/1999 | Wang et al. | |
| 6,008,070 A | 12/1999 | Farnworth | |
| 6,013,946 A | 1/2000 | Lee et al. | |
| 6,020,629 A | 2/2000 | Farnworth et al. | |
| 6,025,728 A | 2/2000 | Hembree et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,054,755 A | 4/2000 | Takamichi et al. | |
| 6,066,514 A | 5/2000 | King et al. | |
| 6,071,758 A | 6/2000 | Steffen | |
| 6,072,236 A | 6/2000 | Akram et al. | |
| 6,075,288 A | 6/2000 | Akram | |
| 6,089,920 A | 7/2000 | Farnworth et al. | |
| 6,094,058 A | 7/2000 | Hembree et al. | |
| 6,097,087 A | 8/2000 | Farnworth et al. | |
| 6,100,598 A | 8/2000 | Kanesaka | |
| 6,103,547 A | 8/2000 | Corisis et al. | |
| 6,107,122 A | 8/2000 | Wood et al. | |
| 6,107,680 A | 8/2000 | Hodges | |
| 6,114,189 A * | 9/2000 | Chia et al. | 438/112 |
| 6,117,382 A * | 9/2000 | Thummel | 264/272.14 |
| 6,124,634 A | 9/2000 | Akram et al. | |
| 6,126,428 A | 10/2000 | Mitchell et al. | |
| 6,143,581 A | 11/2000 | Johnson et al. | |
| 6,150,717 A | 11/2000 | Wood et al. | |
| 6,159,764 A | 12/2000 | Kinsman et al. | |
| 6,168,970 B1 | 1/2001 | Burns | |
| 6,172,419 B1 | 1/2001 | Kinsman | |
| 6,175,159 B1 | 1/2001 | Sasaki | |
| 6,184,465 B1 | 2/2001 | Corisis | |
| 6,191,472 B1 | 2/2001 | Mazumder | |
| 6,198,172 B1 | 3/2001 | King et al. | |
| 6,208,519 B1 | 3/2001 | Jiang et al. | |
| 6,210,992 B1 | 4/2001 | Tandy et al. | |
| 6,215,175 B1 | 4/2001 | Kinsman | |
| 6,228,548 B1 | 5/2001 | King et al. | |
| 6,228,687 B1 | 5/2001 | Akram et al. | |
| 6,229,202 B1 | 5/2001 | Corisis | |
| 6,235,994 B1 | 5/2001 | Chamberlin et al. | |
| 6,242,802 B1 | 6/2001 | Miles et al. | |
| 6,246,108 B1 | 6/2001 | Corisis et al. | |
| 6,252,298 B1 | 6/2001 | Lee et al. | |
| 6,258,623 B1 | 7/2001 | Moden et al. | |
| 6,258,624 B1 | 7/2001 | Corisis | |
| 6,259,153 B1 | 7/2001 | Corisis | |
| 6,262,480 B1 | 7/2001 | Ferri et al. | |
| 6,277,671 B1 | 8/2001 | Tripard | |
| 6,284,571 B1 | 9/2001 | Corisis et al. | |
| 6,291,894 B1 | 9/2001 | Farnworth et al. | |
| 6,291,895 B1 | 9/2001 | Tnaiguchi et al. | |
| 6,294,839 B1 | 9/2001 | Mess et al. | |
| 6,300,165 B2 | 10/2001 | Castro | |
| 6,303,981 B1 | 10/2001 | Moden | |
| 6,303,985 B1 | 10/2001 | Larson et al. | |
| 6,309,916 B1 * | 10/2001 | Crowley et al. | 438/127 |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,329,603 B1 * | 12/2001 | Japp et al. | |
| 6,331,221 B1 | 12/2001 | Cobbley | |
| 6,331,453 B1 | 12/2001 | Bolken et al. | |
| 6,332,766 B1 | 12/2001 | Thummel | |
| 6,338,813 B1 * | 1/2002 | Hsu et al. | 264/272.14 |
| 6,403,009 B1 * | 6/2002 | Saxelby et al. | 264/272.15 |
| 6,413,801 B1 * | 7/2002 | Lin | 438/127 |
| 6,472,252 B2 * | 10/2002 | Mess | 438/126 |
| 6,483,044 B1 * | 11/2002 | Ahmad | |
| 2002/0016023 A1 | 9/2001 | Bolken | |
| 2002/0050654 A1 | 9/2001 | Bolken | |

| | | | |
|---|---|---|---|
| 2002/0052063 A1 | 9/2001 | Bolken |
| 2001/0038144 A1 | 11/2001 | Grigg |
| 2002/0175399 A1 | 3/2002 | James et al. |
| 2003/0029633 A1 | 10/2002 | Ahmad |

FOREIGN PATENT DOCUMENTS

| | | | |
|---|---|---|---|
| JP | 10065043 A | * | 3/1998 |
| JP | 11017048 A | * | 1/1999 |
| JP | 11026489 A | * | 1/1999 |
| JP | 411026484 A | | 1/1999 |
| JP | 11077733 A | * | 3/1999 |
| JP | 2000106375 A | * | 4/2000 |
| JP | 2001076689 A | * | 3/2001 |
| JP | 2001085565 A | | 3/2001 |
| KR | 2001038773 A | | 5/2001 |

OTHER PUBLICATIONS

U.S. patent application Ser. No. 09/644,801, Ahmad, filed Aug. 23, 2000.

U.S. patent application Ser. No. 09/955,620, Bolken, filed Sep. 19, 2001.

U.S. patent application Ser. No. 09/955,897, Bolken, filed Sep. 19, 2001.

U.S. patent application Ser. No. 09/955,612, Bolken, filed Sep. 19, 2001.

U.S. patent application Ser. No. 09/645,640, James et al., filed Aug. 24, 200.

U.S. patent application Ser. No. 09/649,428, Cobbley, filed Aug. 28, 2000.

U.S. patent application Ser. No. 09/595,623, Bolken, filed Jun. 16, 2001.

U.S. patent application Ser. No. 10/267,080, Ahmad, filed Oct. 7, 2002.

U.S. patent application Ser. No. 10/266,848, Ahmad, filed Oct. 7, 2002.

Peter Van Zant, *Microchip Fabrication*, Fourth Edition, McGraw–Hill, New York, Chapter 18, Packaging, pp. 557–593.

* cited by examiner

METHOD AND APPARATUS FOR PACKAGING A MICROELECTRONIC DIE

CROSS REFERENCE TO RELATED APPLICATION

This application is a divisional of pending U.S. patent application Ser. No. 09/595,623, filed on Jun. 16, 2000.

TECHNICAL FIELD

This invention relates to methods and apparatuses for packaging microelectronic devices; more particularly, this invention relates to encapsulating microelectronic dies in the manufacturing of memory devices, microprocessors and other types of microelectronic devices.

BACKGROUND OF THE INVENTION

Many packaged microelectronic devices have a substrate, a microelectronic die attached to the substrate, and a protective covering encasing the die. The protective covering is generally a plastic or ceramic compound that can be molded to form a casing over the die. The microelectronic die can be a memory device, a microprocessor, or another type of microelectronic assembly having integrated circuitry. Several types of packaged devices also include bond pads on the substrate that are coupled to the integrated circuitry of the die. The bond pads may alternatively be coupled to pins or other types of terminals that are exposed on the exterior of the microelectronic device for connecting the die to buses, circuits and/or other microelectronic assemblies.

A significant limiting factor for manufacturing packaged microelectronic devices is encapsulating the die with the protective covering. The dies are sensitive components that should be protected from physical contact and environmental conditions to avoid damaging the die. The protective casing encapsulating the die, therefore, should seal the die from the environmental factors (e.g., moisture) and shield the die from electrical and mechanical shocks.

One conventional technique for encapsulating the die is known as "transfer-molding," which involves placing the die and at least a portion of the substrate in a cavity of a mold and then injecting a thermosetting material into the cavity. The thermosetting material flows over the die on one side of the substrate until it fills the cavity, and then the thermosetting material is cured so that it hardens into a suitable protective casing for protecting the die. The protective casing should not have any voids over the die because contaminants from the molding process or environmental factors could damage the die. The thermosetting material, moreover, should not cover a ball-pad array on the substrate or damage any electrical connections between the die and the substrate. Therefore, it is important to control the flow of the thermosetting material in the cavity to avoid (a) producing voids in the protective casing over the die, (b) covering portions of the substrate with the thermosetting material that are not to be covered with the protective covering, and (c) displacing or otherwise damaging any wiring or solder joints between the die and the substrate.

One drawback of transfer-molding is that it is difficult to avoid producing voids in the thermosetting material. In one particular transfer-molding technique, a first protective casing is formed over the die on a first surface of the substrate, and a second protective casing is formed over contacts on the die and wire-bond connections on a second surface of the substrate. The first casing is formed from a first flow of the thermosetting compound, and the second casing is formed from a second flow of the thermosetting compound. This transfer-molding technique may result in voids along either the first or second surface of the substrate because the first and second flows may counter one another as they flow through the mold. Other transfer-molding techniques may also produce voids in the protective casing over the die because the flow of the thermosetting material in the mold may produce a first flow section that moves in a direction counter to a second flow section. Therefore, it would be desirable to eliminate voids in the protective casing.

SUMMARY OF THE INVENTION

The present invention is directed toward methods and apparatuses for encapsulating a microelectronic die or another type of microelectronic device. One aspect of the present invention is directed toward packaging a microelectronic die that is attached to either a first surface or a second surface of a substrate. The die can be encapsulated by positioning the die in a cavity of a mold and sealing the substrate to the mold. The method can further include injecting an encapsulation compound into the cavity at a first end of the substrate so that the compound moves along the first surface of the substrate. This portion of the compound defines a first flow of compound along the first surface that moves in a first direction from a first end of the mold toward a second end of the mold. The method can also include driving a portion of the compound through the substrate at a pass-through location or a secondary gate that is spaced apart from the first end of the substrate to generate a second flow of compound along the second surface of the substrate. The second flow of compound moves in a second direction toward the first end of the mold. As the first and second flows of compound move through the mold, the method includes inhibiting a third flow of compound from moving in the first direction along the second surface of the substrate between the first end of the substrate and the pass-through location.

Another aspect of this invention is a microelectronic device comprising a substrate, a microelectronic die attached to substrate, and a cover encasing at least a portion of the die. The substrate can have a first surface, a second surface, and plurality of ball-pads on the second surface. The microelectronic die can have a first side attached to the first surface of the substrate, a plurality of contacts on the first side, and an integrated circuit coupled to the contacts. The contacts of the die can be electrically coupled to the ball-pads of the substrate by a plurality of connectors. The cover can further include a first casing encapsulating the die and a portion of the first surface of the substrate, and a second casing encapsulating the contacts on the first side of the die and the connectors. The first casing has a first end, a second end, a first gate section at the first end, and a second gate section also at the first end. The first and second gate sections are spaced apart from one another along the first end.

DETAILED DESCRIPTION

The following disclosure is directed toward packaged microelectronic devices, and to methods for encapsulating a microelectronic die or another type of microelectronic device. Several embodiments of the invention are described with respect to memory devices, but the methods and apparatuses are also applicable to microprocessors and other types of devices. One skilled in the art will accordingly understand that the present invention may have additional embodiments, or that the invention may be practiced without several of the details described below.

Figure 1:
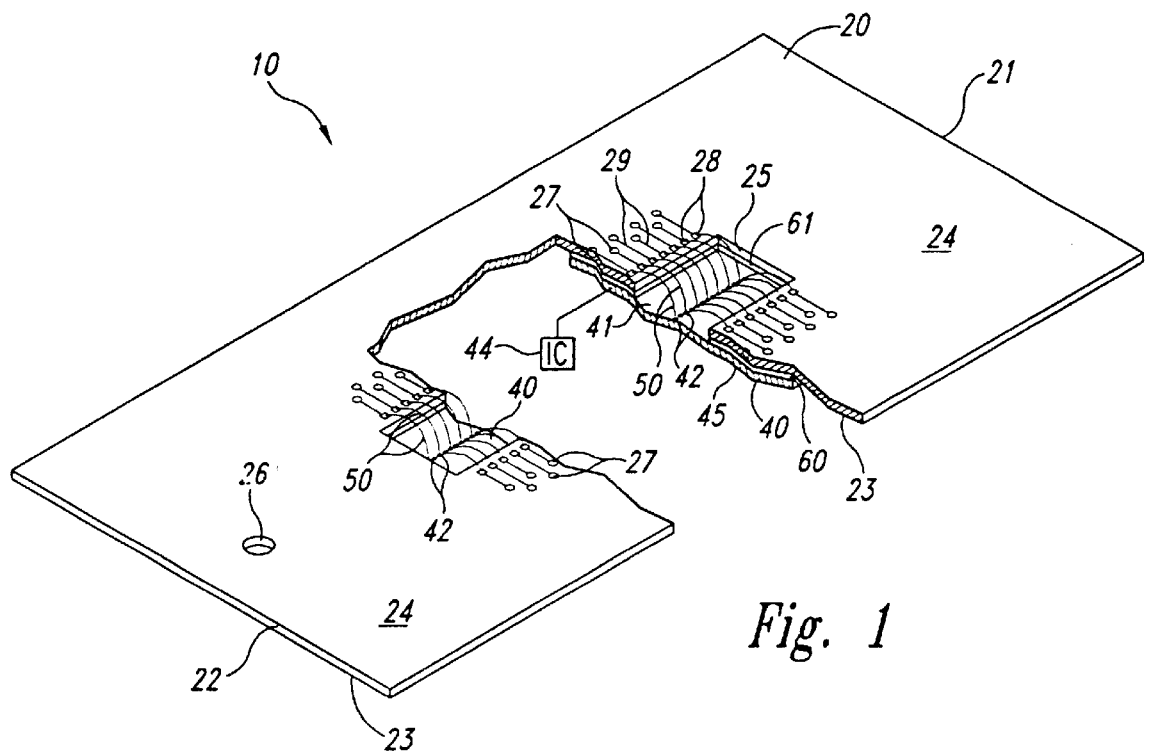
FIG. 1 is a top cutaway isometric view of a microelectronic device before being packaged in accordance with a method of one embodiment of the invention.

FIG. 1 is a top cutaway isometric view of a microelectronic device 10 that is to be encapsulated using a method in accordance with one embodiment of the invention. The microelectronic device 10 can include a substrate 20 and a microelectronic die 40 attached to the substrate 20 by an adhesive 60. The microelectronic device 10 shown in FIG. 1 illustrates the substrate 20 and the die 40 before encapsulating the die 40 with an encapsulation compound, such as a mold compound. The following description is directed toward encapsulating a microelectronic die on a flexible substrate, but it is expected that several embodiments of methods and molds in accordance with the present invention may be used to encapsulate a large variety of electrical and/or non-electrical articles. Therefore, the following description with respect to encapsulating the microelectronic die 10 shown in FIGS. 1–6 is for purposes of illustration only, and is not intended to limit the scope of the invention.

The embodiment of the substrate 20 shown in FIG. 1 can have a first end 21, a second end 22 opposite the first end 21, a first surface 23, and a second surface 24 opposite the first surface 23. The substrate 20 can also include an elongated slot 25 between the first and second surfaces 23 and 24 that extends lengthwise along a medial portion of the substrate 20. Additionally, an aperture 26 can extend through the substrate 20 at secondary gate location or a pass-through location that is generally proximate to the second end 22 of the substrate 20. The substrate 20 is generally an interposing device that provides an array of ball-pads for coupling very small contacts on the microelectronic die to another type of device. In the embodiment shown in FIG. 1, the substrate 20 includes a first array of ball-pads 27, a second array of terminal pads 28 proximate to the slot 25, and a trace 29 or other type of conductive line between each ball-pad 27 and corresponding terminal pad 28. The substrate 20 can be a flexible material or a substantially rigid material, and the traces 29 can be conductive lines that are printed on the substrate in a manner similar to printed circuit boards.

The embodiment of the microelectronic die 40 shown in FIG. 1 includes a first side 41 attached to the first surface 23 of the substrate 20 by the adhesive 60. The microelectronic die 40 can also include a plurality of small contacts 42 and an integrated circuit 44 (shown schematically) coupled to the contacts 42. The contacts 42 are arranged in an array along the first side 41 of the microelectronic die 40 so that the contacts 42 are aligned with or otherwise accessible through the slot 25 in the substrate 20. A plurality of wire-bonds or other types of connectors 50 couple the contacts 42 of the die 40 to corresponding terminal pads 28 on the substrate 20. As such, the substrate 20 distributes the very small contacts 42 to the larger array of ball-pads 27.

The adhesive 60 can be a two-sided tape or a decal adhered to the first surface 23 of the substrate 20 adjacent to the sides of the slot 25. In a typical application, the adhesive 60 creates a small gap 61 at the end of the slot 25 toward the first end 21 of the substrate 20. The gap 61 is defined by the distance between the first surface 23 of the substrate 20 and the first side 41 of the die 40, which is generally equal to the thickness of the adhesive 60. As explained in more detail below, the gap 61 can create several difficulties in encapsulating the terminal pads 28, the connectors 50, and the contacts 42.

Figure 2:
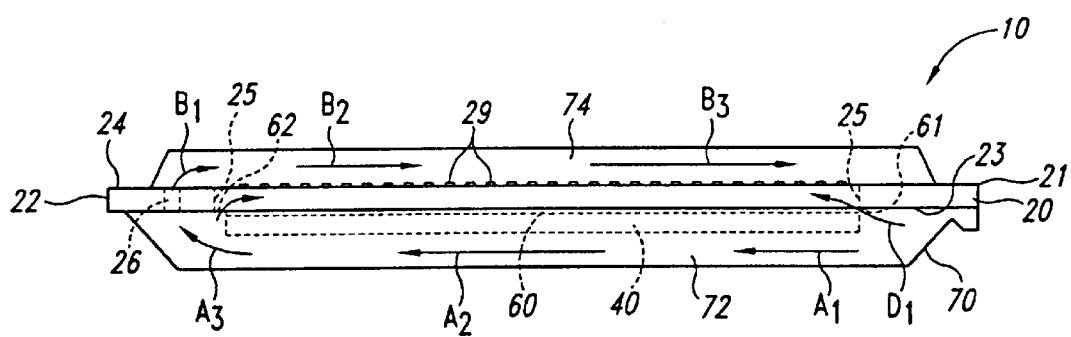
FIG. 2 is a side elevation view of the microelectronic device of FIG. 1.

FIG. 2 is a side elevation view of the microelectronic device 10 after the die 40 and a portion of the substrate 20 have been encapsulated by a mold compound 70. The mold compound 70 can be injected into a mold (not shown in FIG. 2) to form a first casing 72 that encapsulates the die 40 and a second casing 74 that fills the slot 25 (FIG. 1). The first casing 72 also covers a portion of the first surface 23 of the substrate 20, and the second casing 74 also covers the terminal pads 28 on the substrate 20 (FIG. 1), the connectors 50 (FIG. 1), and the contacts 42 on the die 40 (FIG. 1).

The first casing 72 can be formed by injecting the mold compound through a gate of a mold at the first end 21 of the substrate 20 so that the mold compound flows along the first surface 23 of the substrate 20 in a first direction (shown by arrows $A_1$–$A_3$). The second casing 74 is then formed by driving a portion of the mold compound through the aperture 26 and/or another opening 62 defined by another gap at the other end of the slot 25 toward the second end 22 of the substrate 20. The aperture 26 and/or the opening 62 define a pass-through location or a secondary gate location that is spaced apart from the first end 21 of the substrate 20 to generate a second flow of compound along the second surface 24 of the substrate 20 (shown by arrows $B_1$–$B_3$). The second flow of mold compound moves in a second direction away from the second 22 end of the substrate 20 toward the first end 21.

The process of fabricating the first and second casings 72 and 74 can be difficult because a third flow of mold compound may pass through the gap 61 between the die 40 and the substrate 20 at the end of the slot 25 toward the first end 21 of the substrate 20 (arrow $D_1$). Such a third flow of mold compound would move counter to the second flow of mold compound along the second surface 24 of the substrate 20. As a result, voids or other disparities may be created in the second casing 74 where the third flow of mold compound (arrow $D_1$) meets the second flow of mold compound (arrows $B_1$–$B_3$). One aspect of the present invention is to inhibit creating the third flow of mold compound that moves in the first direction along the second surface 24 of the substrate 20 between the first end of the substrate 21 and the pass-through location toward the second end 22 of the substrate 20.

Figure 3A:
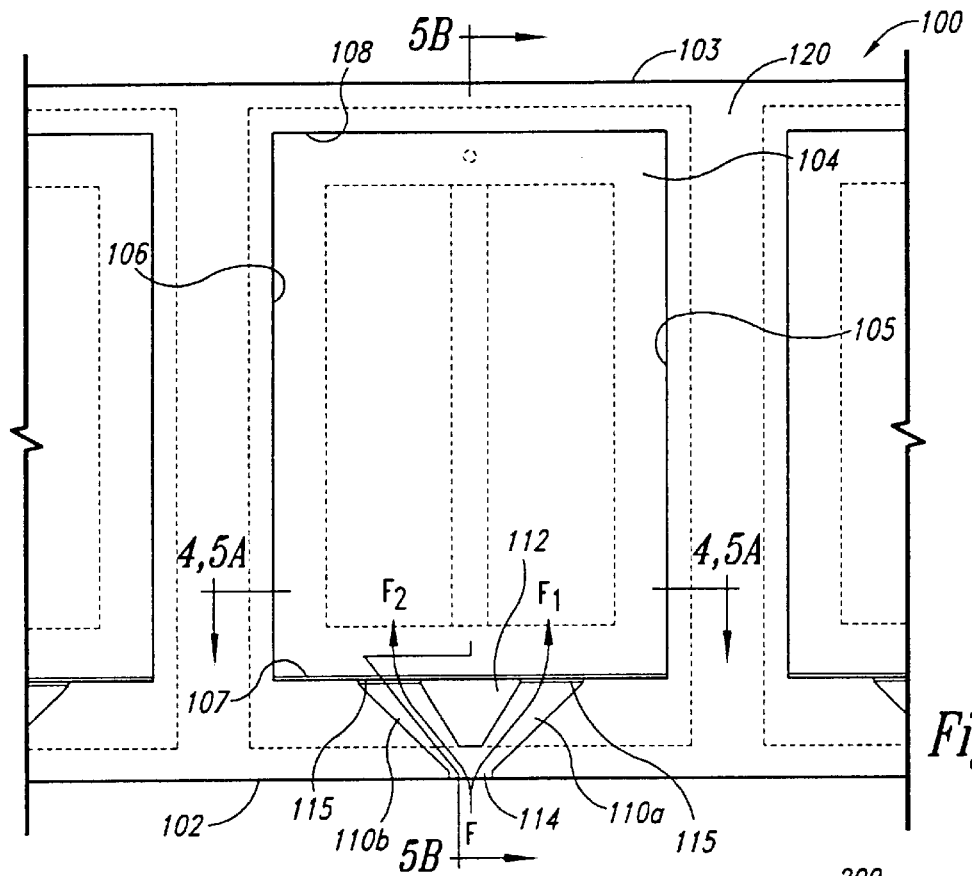
FIG. 3A is a top plan view of a first mold section for encapsulating a microelectronic device in accordance with an embodiment of the invention.
Figure 3B:
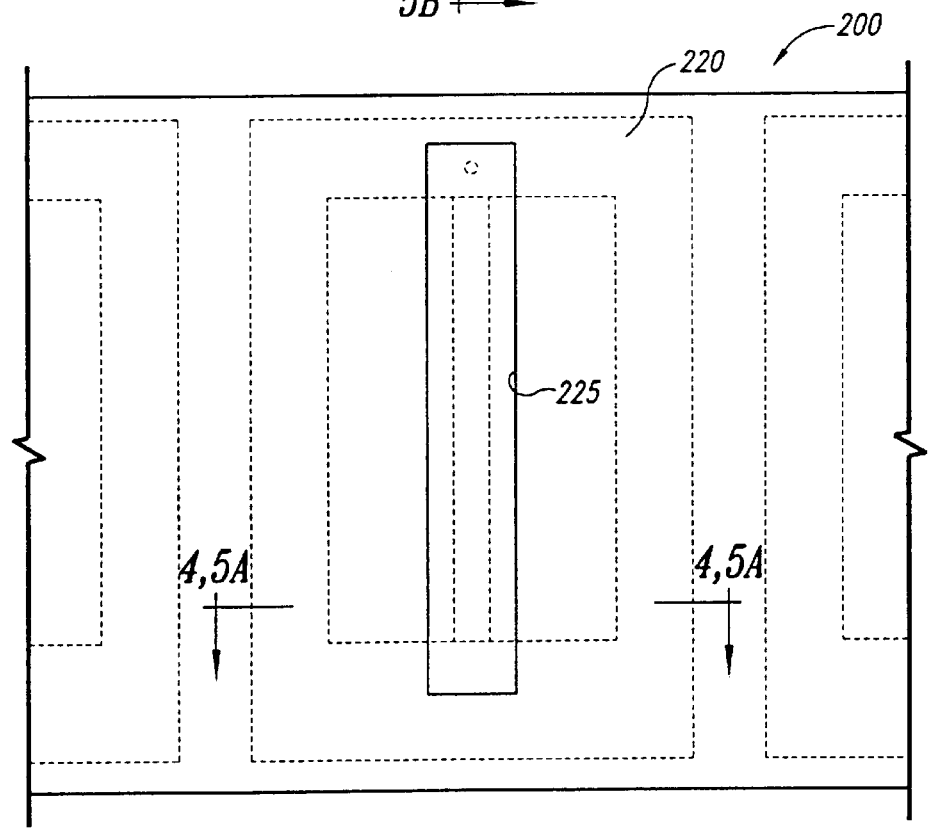
FIG. 3B is a bottom plan view of a second mold section for use with the first mold section of FIG. 3A.

FIG. 3A is a top plan view of a first mold section 100 and FIG. 3B is a bottom plan view of a second mold section 200 for forming the first and second casings 72 and 74 (FIG. 2) in a manner that inhibits or eliminates a third flow of mold compound through the gap 61 (FIG. 1) between the substrate 20 and the die 40. The embodiment of the first mold section 100 shown in FIG. 3A includes a first end 102, a second end 103, a bearing surface 120 for contacting the first side 23 of the substrate 20 (FIG. 1), and a first cavity 104 for receiving the die 40 (FIG. 1). The cavity 104 can have a first side 105, a second side 106 opposite the first side, a first end 107, and a second end 108 opposite the first end. The first mold section 100 can also include a plurality of gates including at least a first gate 110a and a second gate 110b that are separated from one another by an island 112. The first gate 110a can open into the cavity 104 at a location proximate to the first side 105, and the second gate 110b can open into the cavity 104 at a location proximate to the second side 106. The first and second gates 110a and 110b can meet at a common feed port 114. The first and second gates 110a and 110b define a gate pair that is coupled to a common first cavity 104 in the first mold section. The first mold section 100 can further include a flow restrictor 115 at the end of each of the first and second gates 110a and 110b. In operation, an injection flow F of molding compound or encapsulating compound is injected through the feed port 114 and the gates 110a and 110b. The island 112 splits the injection flow F into a first injection flow $F_1$ passing through the first gate 110a and a second injection flow $F_2$ passing through the second gate 110b.

FIG. 3B illustrates an embodiment of a second mold section 200 for forming the second casing 74 (FIG. 2) over the slot 25 of the substrate 20 (FIG. 1). The second mold section 200 can include a bearing surface 220 for contacting the second side 24 of the substrate 20 (FIG. 1). The second mold section 200 can also include a second cavity 225 configured to be superimposed over the slot 25 of the substrate 20 when the bearing surface 220 engages the first surface 24 of the substrate 20.

Figure 4:
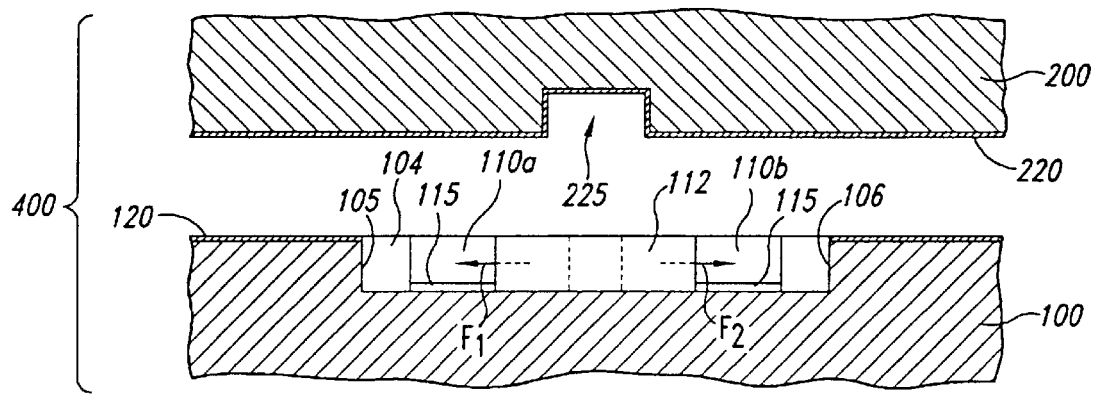
FIG. 4 is a partial front cross-sectional view of the first and second mold sections of FIGS. 3A and 3B in an operating position in accordance with an embodiment of the invention.

FIG. 4 is a partial cross-sectional view of a mold assembly 400 including the first mold section 100 shown in FIG. 3A and the second mold section 200 shown in FIG. 3B. The first mold section 100 is superimposed under the second mold section 200 so that the second cavity 225 of the second encapsulating section is over the first cavity 104 of the first mold section 100. The island 112 positions the opening of the first gate 110a toward the first side 105 of the first cavity 104 and the opening of the second gate 110b toward the second side 106 of the first cavity 104. Referring to FIGS. 3A and 4 together, the first injection flow $F_1$ flows through the first gate 110a and enters the cavity 104 proximate to the first side 105, and a second injection flow $F_2$ flows through the second gate 110b and enters the cavity 104 proximate to the second side 106.

The first mold section 100 can have a plurality of individual first cavities 104, and the second mold section 200 can have a plurality of individual second cavities 225. The first cavities 104 are arranged with respect to the second cavities 225 so that each first cavity 104 is superimposed under a corresponding second cavity 225. Additionally, the first mold section 100 can have a plurality of gate pairs that each have a first gate 110a and a second gate 110b. The openings of the first and second gates 110a and 110b of each gate pair are spaced apart from one another at the first end 107 of a corresponding first cavity 104. As such, the first mold section 100 can form a first casing 72 and a second casing 74 on a plurality of individual microelectronic devices in a single molding cycle in a manner that provides a bifurcated flow of mold compound into the first end of each of the first cavities 104.

Figure 5A:
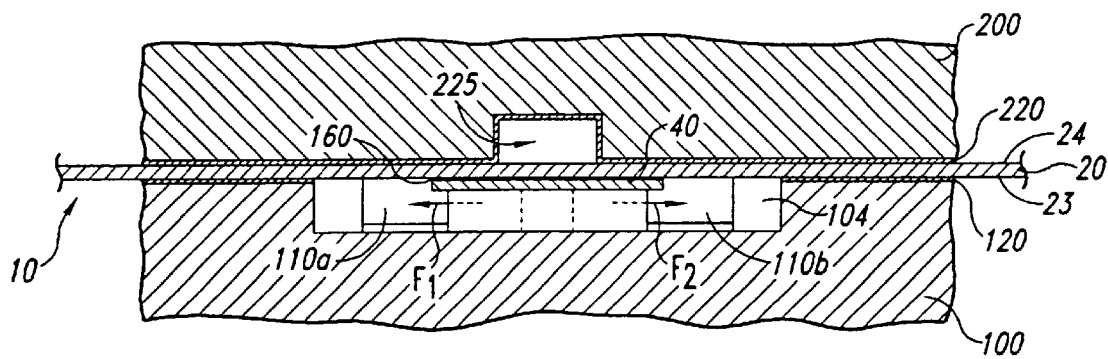
FIG. 5A is a partial front cross-sectional view of a microelectronic device being packaged using the first and second mold sections of FIG. 4 according to an embodiment of the invention.
Figure 5B:
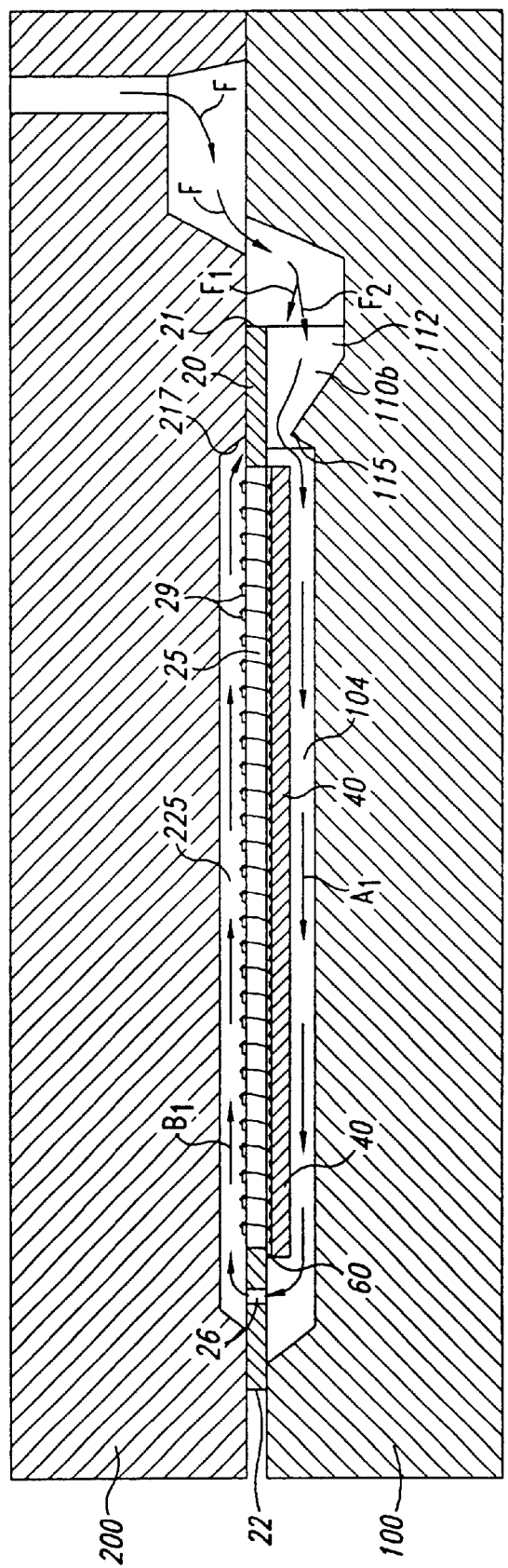
FIG. 5B is a side cross-sectional view of the microelectronic device of FIG. 5A being packaged using the first and second mold sections of FIG. 4 in accordance with an embodiment of the invention.

FIGS. 5A and 5B illustrate an embodiment of a method for encapsulating the microelectronic die 40 and the slot 25 of the substrate 20. FIG. 5A, more specifically, is a partial front cross-sectional view illustrating the microelectronic device 10 being encapsulated using the first and second mold sections 100 and 200. In this embodiment, the bearing surface 120 of the first mold section 100 presses against a perimeter portion of the first surface 23 of the substrate 20, and the bearing surface 220 of the second mold section 200 presses against the second surface 24 of the substrate 20. The bearing surface 220 of the second mold section 200 can press against the second surface 24 of the substrate 20 by injecting a mold compound into the cavity 104, as explained in U.S. patent application Ser. No. 09/255,554, which is herein incorporated by reference. The first and second injection flows $F_1$ and $F_2$ of the mold compound pass through the first and second gates 110a and 110b to enter the cavity 104 along the side regions of the microelectronic die 40. As a result, the high pressure flow of mold compound does not flow directly toward the gap 61 (FIG. 1) between the substrate 20 and the die 40 proximate to the first end 21 of the substrate 20. The first and second injection flows $F_1$ and $F_2$ of the mold compound accordingly fill the first cavity 104 in a manner that does not cause the mold compound to generate a flow in the slot 25 of the substrate 20 that flows toward the second end 22 of the substrate 20. Therefore, the first and second gates 110a and 110b provide a mold that inhibits voids or other asperities from forming in the second casing 74. Moreover, the first mold section 100 surprisingly does not create voids or asperities in the first casing 72 even though it produces a bifurcated flow of mold compound in the first cavity 104.

FIG. 5B is a side cross-sectional view illustrating the flow of mold compound through the first and second mold sections 100 and 200. The first and second injection flows $F_1$ and $F_2$ of mold compound flow past the island 112 and into the first end 107 of the first cavity 104 to create a first flow $A_1$ heading in a first direction toward the second end 22 of the substrate 20. The first flow $A_1$ of mold compound passes through the aperture 26 at the pass-through location toward the second end 22 of the substrate 20 to generate a second flow $B_1$ of mold compound that flows through the second cavity 225 of the second mold section 200. The second flow $B_1$ of mold compound fills the slot 25 of the substrate 20 and flows in a second direction until it reaches a terminal end 217 of the second cavity 225.

Figure 6:
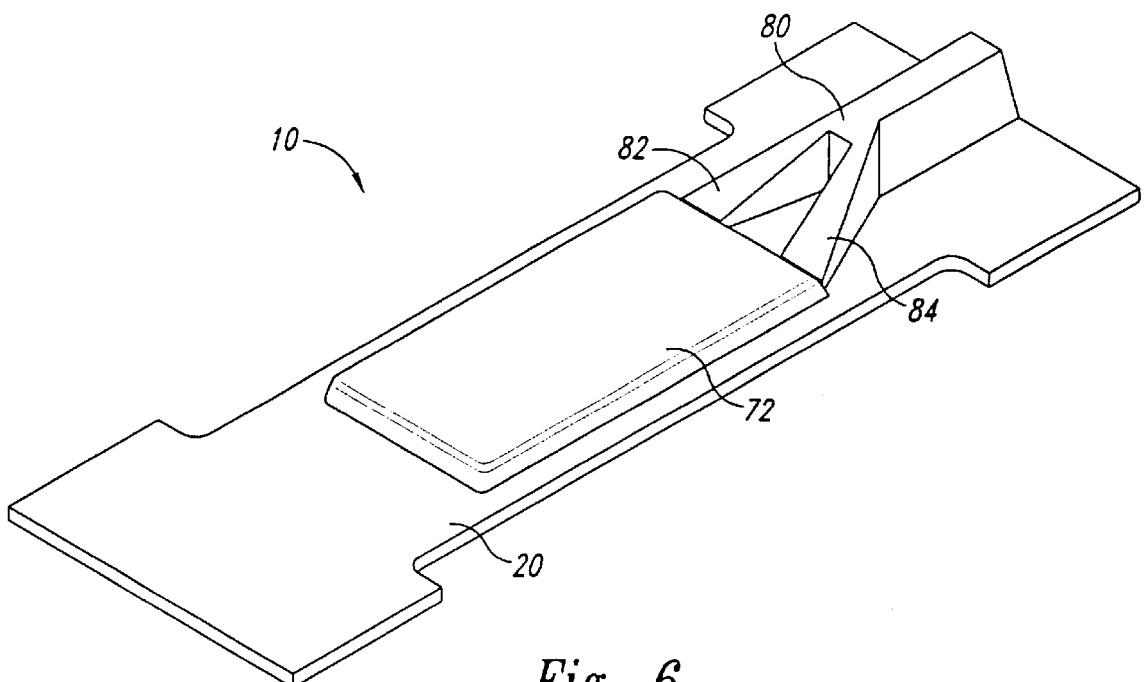
FIG. 6 is a top isometric view of a packaged microelectronic device before singulation in accordance with an embodiment of the invention.

FIG. 6 is a top isometric view of an encapsulated microelectronic device 10 having the first casing 72 over the die 40 on the first surface 23 of the substrate 20. FIG. 6 illustrates the microelectronic device 10 before it has been "singulated" to remove unnecessary portions of the substrate 20 and molding compound. In this embodiment, the microelectronic die 40 (FIG. 1) and a portion of the substrate 20 are encapsulated by the first casing 72. Before singulating the device, the microelectronic device 10 includes a flash section 80 of mold compound having a first gate section 82 and second gate section 84. The first gate section 82 corresponds to the portion of the mold compound in the first gate 110a (FIG. 3A) at the end of the encapsulating process, and the second gate section 84 corresponds to the portion of the mold compound in the second gate 110b.

Figure 7:
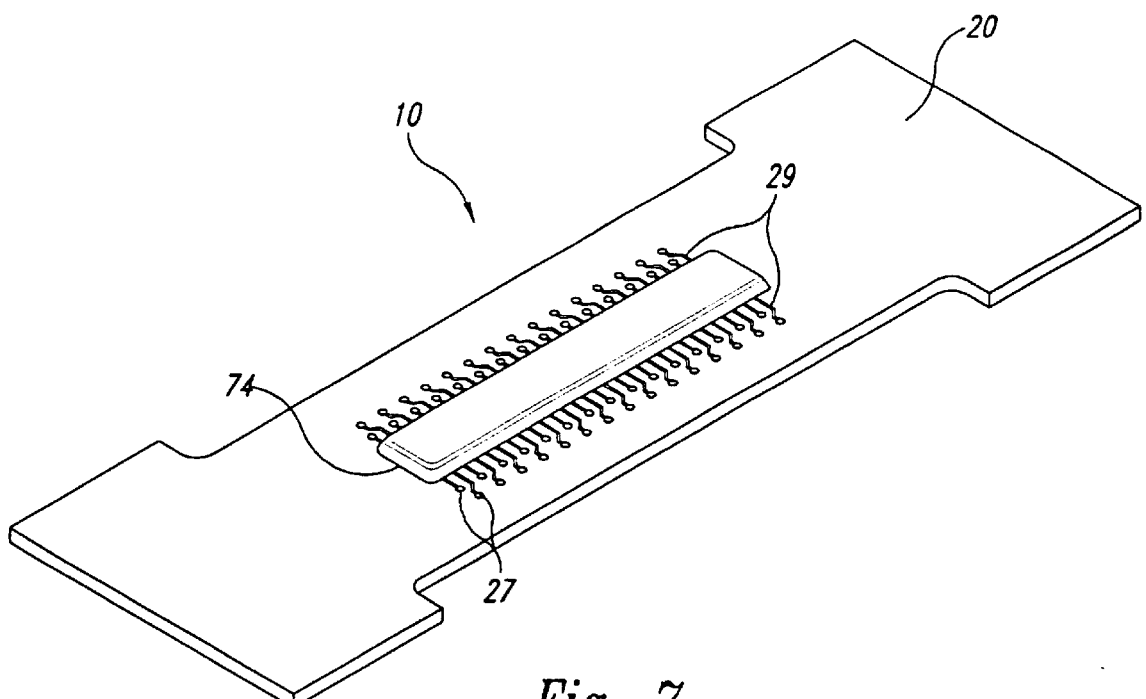
FIG. 7 is a bottom isometric view of a packaged microelectronic device in accordance with an embodiment of the invention.

FIG. 7 is a bottom isometric view of the microelectronic device 10 having the second casing 74 over the slot 25 of the substrate 20. In this embodiment, the second casing 74 covers the terminal pads 28 (FIG. 1), the connectors 50 (FIG. 1), and the contacts 42 on the first surface 41 of the die 40 (FIG. 1). The microelectronic device 10 is then singulated to remove the excess portion of the flash 80 and the substrate 20.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of encapsulating a microelectronic device having a substrate and a microelectronic die attached to a first surface of the substrate, the method comprising:

positioning the substrate between a first mold section having a first cavity and a second mold section having a second cavity, wherein the die is in one of the first or second cavities, and wherein a second surface of the substrate faces the other of the first or second cavities;

injecting a mold compound into the first cavity of the first mold section at a first end of the substrate to create a first flow of mold compound moving through the first cavity toward a second end of the substrate;

driving a portion of the first flow of mold compound through a secondary gate located toward the second end of the substrate to create a second flow of mold compound that moves through the second cavity toward the first end of the substrate; and inhibiting a counter flow of mold compound from moving through the second cavity from the first end of the substrate toward the second end of the substrate.

2. The method of claim 1 wherein inhibiting a counter flow of mold compound from moving through the second cavity comprises hindering the first flow of mold compound from passing through the substrate at a location proximate to the first end of the substrate.

3. The method of claim 1 wherein:

the first mold section has a first gate at a first end of the first cavity and a second gate also at the first end of the first cavity, the first and second gates being spaced apart from one another; and inhibiting a counter flow comprises preventing the first flow of mold compound from passing through the substrate at the first end of the substrate by injecting the mold compound into the first cavity through the first and second gates to bifurcate the first flow in the first cavity at the first end of the substrate.

4. The method of claim 1 wherein:

the substrate has a slot aligned with a contact array on the die; and inhibiting a counter flow comprises preventing the first flow of mold compound from passing through a gap at an end of the slot proximate to the first end of the substrate by injecting the mold compound into the first cavity such that a flow path of the injected flow is not aligned with the slot in the substrate.

5. A method of packaging an article, comprising:

attaching a microelectronic die to one of a first surface or a second surface of a substrate such that an array of contacts on the die is accessible from the other of the first or second surface of the substrate;

coupling the contacts of the die to corresponding terminal pads on the other of the first or second surface of the substrate;

positioning the substrate between a first mold section having a first cavity and a second mold section having a second cavity, wherein the die is in one of the first or second cavities, and wherein the second side of the substrate is in the other of the first or second cavities;

injecting a mold compound into the first cavity of the first mold section at a first end of the substrate to create a first flow of mold compound moving through the first cavity toward a second end of the substrate;

driving a portion of the first flow of mold compound into the second cavity at a location toward the second end of the substrate to create a second flow of mold compound that moves through the second cavity toward the first end of the substrate; and inhibiting a counter flow of mold compound from moving through the second cavity from the first end of the substrate toward the second end of the substrate.

6. The method of claim 5 wherein inhibiting a counter flow of mold compound from moving through the second cavity comprises hindering the first flow of mold compound from passing through the substrate at the first end of the substrate.

7. The method of claim 6 wherein:

the first mold section has a first gate at a first end of the first cavity and a second gate also at the first end of the first cavity, the first and second gates being spaced apart from one another; and hindering the first flow of mold compound from passing through the substrate at the first end of the substrate comprises injecting the mold compound into the first cavity through the first and second gates to bifurcate the first flow in the first cavity at the first end of the substrate.

* * * * *

UNITED STATES PATENT AND TRADEMARK OFFICE
CERTIFICATE OF CORRECTION

PATENT NO. : 6,664,139 B2
DATED : December 16, 2003
INVENTOR(S) : Todd O. Bolken It is certified that error appears in the above-identified patent and that said Letters Patent is hereby corrected as shown below:

<u>Title page,</u>
Item [56], References Cited, U.S. PATENT DOCUMENTS, "Ramano" should be
-- Romano' --;

Signed and Sealed this

Second Day of March, 2004

JON W. DUDAS
*Acting Director of the United States Patent and Trademark Office*